(12) United States Patent
Fukumoto et al.

(10) Patent No.: US 7,522,823 B2
(45) Date of Patent: Apr. 21, 2009

(54) THERMAL PROCESSING APPARATUS, THERMAL PROCESSING METHOD, AND SUBSTRATE PROCESSING APPARATUS

(75) Inventors: Yasuhiro Fukumoto, Kyoto (JP); Mitsuhiro Masuda, Kyoto (JP); Toru Azuma, Kyoto (JP)

(73) Assignee: Sokudo Co., Ltd., Kyoto (JP)

( * ) Notice: Subject to any disclaimer, the term of this patent is extended or adjusted under 35 U.S.C. 154(b) by 0 days.

(21) Appl. No.: 10/926,718

(22) Filed: Aug. 26, 2004

(65) Prior Publication Data

US 2005/0058440 A1    Mar. 17, 2005

(30) Foreign Application Priority Data

Sep. 17, 2003    (JP) .............................. 2003-325113

(51) Int. Cl.
    *F26B 19/00* (2006.01)
    *H05B 3/68* (2006.01)
(52) U.S. Cl. .................................. 392/418; 219/444.1
(58) Field of Classification Search ................ 219/390, 219/405, 411, 393, 396; 392/416, 418; 118/50.1, 118/724, 725, 728, 729
    See application file for complete search history.

(56) References Cited

U.S. PATENT DOCUMENTS

| | | | | |
|---|---|---|---|---|
| 5,202,716 A | * | 4/1993 | Tateyama et al. | 396/624 |
| 5,620,560 A | | 4/1997 | Akimoto et al. | 216/41 |
| 5,700,127 A | * | 12/1997 | Harada et al. | 414/416.08 |
| 6,062,852 A | * | 5/2000 | Kawamoto et al. | 432/258 |
| 6,228,171 B1 | * | 5/2001 | Shirakawa | 118/666 |
| 6,402,508 B2 | | 6/2002 | Harada et al. | |
| 6,426,303 B1 | * | 7/2002 | Ueda | 438/716 |
| 6,499,777 B1 | * | 12/2002 | Wang | 294/1.1 |
| 6,515,731 B1 | * | 2/2003 | Akimoto | 355/27 |
| 6,610,150 B1 | * | 8/2003 | Savage et al. | 118/719 |
| 6,814,507 B2 | * | 11/2004 | Inagaki | 396/571 |
| 7,186,297 B2 | * | 3/2007 | Asano | 118/728 |
| 2003/0185561 A1 | | 10/2003 | Inagaki | 396/611 |

FOREIGN PATENT DOCUMENTS

| | | |
|---|---|---|
| JP | 04-278561 | 10/1992 |
| JP | 11-008175 | 1/1999 |
| JP | 2001-230201 | 8/2001 |
| JP | 3240383 | 10/2001 |
| JP | 2003-068726 | 3/2003 |
| JP | 2003-086651 | 3/2003 |
| JP | 2003-289093 | 10/2003 |

OTHER PUBLICATIONS

Office Action for Japanese Patent Application No. 200-325113, dated Nov. 6, 2007 and English Translation, 6 pages total.
Japanese Office Action for JP Patent Application No. 2003-325113, dated Jan. 25, 2008, 4 pages total (including English translation).

* cited by examiner

*Primary Examiner*—Sang Y Paik
(74) *Attorney, Agent, or Firm*—Townsend and Townsend and Crew LLP

(57) ABSTRACT

In a thermal processing unit, a substrate is held by a local transport hand to be transported between a transfer section and a heating unit, and subjected to a heat processing by the heating unit. Also, the local transport hand is cooled by a cooling plate in the transfer section.

16 Claims, 11 Drawing Sheets

THERMAL PROCESSING APPARATUS, THERMAL PROCESSING METHOD, AND SUBSTRATE PROCESSING APPARATUS

BACKGROUND OF THE INVENTION

1. Field of the Invention

The present invention relates to a thermal processing apparatus, a thermal processing method for performing a thermal processing to a substrate, and a substrate processing apparatus using the thermal processing apparatus.

2. Description of the Background Art

Conventionally, a thermal processor for subjecting a substrate to a thermal processing is mounted in a substrate processing apparatus including a semiconductor processing apparatus. The thermal processor includes a heating unit called a hot plate in which temperature is increased to a predetermined temperature, and a cooling unit called a cool plate in which temperature is decreased to a predetermined temperature.

Normally, a substrate after a heat processing is subjected to a cooling processing for cooling to a predetermined temperature. On the other hand, a substrate after resist-coated and developed is subjected to a heat processing for heating to a predetermined temperature. These cooling and heat processings require certain cooling and heating times, which are regarded very important in the formation of a substrate.

The number of thermal processors to be mounted in the substrate processing apparatus is determined depending on the balance of the processing capabilities of a resist coater, developer, and the like. The number of the thermal processors to be mounted varies correspondingly, although a plurality of thermal processors are normally mounted in one substrate mounting apparatus. In the case where the plurality of thermal processors are mounted in one substrate processing apparatus, disturbances due to the influence of heat from other processors and the like must be suppressed. However, because of the limitation for the layout of installation space or peripheral processors, it is difficult to arrange the plurality of thermal processors in a distributed manner; therefore, the plurality of thermal processors are required to be housed in a special shelf called a bake box. In the bake box where a large number of thermal processors are mounted, however, temperature adjustment for the heat cannot be efficiently performed due to the heat transfer among the thermal processors.

Further, a heated substrate after the heat processing is transported by a hand, which leads to accumulation of heat in the hand from the heated substrate. In one technique, a water duct and the like were provided around the hand for cooling. This technique, however, requires a large working space, in which the number of thermal processors to be mounted varies depending on the structure of the substrate processing apparatus, thus resulting in a problem of the cost.

Japanese Patent Laid-Open No.3240383 discloses a thermal processing apparatus which enables reduced heat/cooling processing times for an object to be processed, while maintaining the evenness of the in-plane temperature distribution of the object and improving product yields.

According to this thermal processing apparatus, there is provided a first transport means for transporting a plate-shaped object to be processed between a thermal processor and a resist processor, and additionally a second transport means for transporting the object between predetermined processors in the thermal processor, so that the object which has been subjected to a heat processing by a heating unit is received by the second transport means with a cooling temperature adjustment function which cools the object to a predetermined temperature, to transfer the object to a cooling section.

Therefore, with the thermal processing apparatus to Japanese Patent Laid-Open No.3240383, the object which has been subjected to the heat processing can be quickly transported to the cooling section, which may result in reduced influence of heat on the object, and also improved throughput. Here, the second transport means comprises the cooling temperature adjustment function, which allows the object being transported to undergo the cooling processing, thereby further improving the throughput.

In the thermal processing apparatus described in Japanese Patent Laid-Open No.3240383, however, because of the cooling temperature adjustment function provided to the second transport means, a water-cooled pipe and the like provided in the cooling temperature adjustment function are caused to slide as the second transport means moves. The durability of the water-cooled pipe and particles derived from the sliding water-cooled pipe have resulted in a big problem.

SUMMARY OF THE INVENTION

It is an object of the present invention to provide a thermal processing apparatus, a thermal processing method, and a substrate processing apparatus in which the accumulation of heat in a holding unit of a substrate transport mechanism can be suppressed with a simple structure without a decrease in the throughput of substrate processing.

A thermal processing apparatus according to one aspect of the present invention for performing a thermal processing to a substrate comprises: a transfer section for receiving/transferring a substrate; a heating unit that performs a heat processing to the substrate; a substrate transport mechanism having a holding unit movable while holding the substrate, and transporting the substrate held by the holding unit between the heating unit and the transfer section; and a cooling unit provided in the transfer section for cooling the holding unit of the substrate transport mechanism.

In the thermal processing apparatus, the substrate is held by the holding unit of the substrate transport mechanism to be transported between the transfer section and the heating unit, and the substrate is subjected to a heat processing by the heating unit. Moreover, the holding unit of the substrate transport mechanism is cooled by the cooling unit in the transfer section.

This suppresses the accumulation of heat in the holding unit of the substrate transport mechanism. Accordingly, the substrate being transported between the transfer section and the heating unit is precluded from being affected by the heat.

Further, the holding unit of the substrate transport mechanism can be cooled in the transfer section during heating of the substrate by the heating unit, thus avoiding a decrease in the throughput of substrate processing.

In this case, since the cooling unit is provided in the transfer section, the holding unit can be readily cooled without complicating the structure of the holding unit of the substrate transport mechanism.

The heating unit and the cooling unit may be arranged to be vertically stacked.

In this case, the thermal processing apparatus can be made smaller and more compact. Additionally, heat atmosphere in the heating unit is precluded from upward or downward transfer.

The thermal processing apparatus may further comprise a control device that controls the substrate transport mechanism so that the holding unit is cooled by the cooling unit during the heat processing of the substrate by the heating unit.

In this case, the heat processing of the substrate by the heating unit and the cooling of the holding unit in the cooing unit are performed in parallel, thus avoiding a decrease in the throughput of substrate processing.

The cooling unit may include a cooling plate with which the holding unit can come into contact. In this case, the holding unit of the substrate transport mechanism is brought in contact with the cooling plate, which facilitates cooling of the holding unit.

The cooling plate may have a cooling circulation path through which a refrigerant is circulated. In this case, the refrigerant is circulated through the cooling circulation path, which facilitates cooling of the cooling plate.

The cooling plate may be arranged between the transfer section and the heating unit. In this case, atmosphere between the heating unit and the transfer section is shielded by the cooling plate, so that the heat atmosphere in the heating unit is precluded from affecting the substrate on standby in the transfer section.

The control device may control the substrate transport mechanism so that the holding unit comes into contact with the cooling plate during cooling of the holding unit.

In this case, the holding unit of the substrate transport mechanism is brought in contact with the cooling plate by the control of the control unit, resulting in cooling of the holding unit. Accordingly, it is not necessary to provide a special mechanism in order to bring the holding unit in contact with the cooling plate.

The transfer section may include a support member provided to project upward from the cooling plate to support a rear side of the substrate.

In this case, the substrate is supported by the support member projecting upward from the cooling plate, so that the substrate on standby in the transfer section is precluded from being affected by the atmosphere from below.

The heating unit may include a movable support member provided to move vertically to support the rear side of the substrate.

In this case, the substrate is supported by the movable support member provided to move vertically from the heating unit.

The holding unit may have a slit to avoid interference between the movable support member provided in the heating unit and the support member provided in the transfer section. In this case, the slit in the holding unit precludes the interference between the holding unit and the movable support member and support member, so that the substrate can be received/transferred readily and reliably.

The support member may include a plurality of support pins. In this case, the rear side of the substrate can be stably supported with the plurality of support pins. Moreover, the use of the support pins provides a smaller area for supporting the rear side of the substrate, thereby minimizing the influence on the rear side of the substrate.

The thermal processing apparatus may further include a detection device that detects the presence/absence of the substrate in the transfer section. In this case, the presence/absence of the substrate is detected by the detection device, so that the timing for carrying in and taking out the substrate can be readily controlled.

A substrate processing apparatus according to another aspect of the present invention comprises: a thermal processing apparatus that performs a thermal processing to a substrate; and a substrate transport device that carries/takes out the substrate into/from the thermal processing apparatus while transporting the substrate, the thermal processing apparatus comprising: a transfer section for receiving/transferring the substrate; a heating unit that performs a heat processing to the substrate; a substrate transport mechanism having a holding unit movable while holding the substrate, and transporting the substrate held by the holding unit between the heating unit and the transfer section; and a cooling unit provided in the transfer section for cooling the holding unit of the substrate transport mechanism.

In the substrate processing apparatus, the substrate is carried/taken out into/from the transfer section in the thermal processing apparatus while being transported by the substrate transport device. The substrate is held by the holding unit of the substrate transport mechanism to be transported between the transfer section and heating unit, and subjected to a heat processing by the heating unit. Moreover, the holding unit of the substrate transport mechanism is cooled by the cooling unit in the transfer section.

This suppresses the accumulation of heat in the holding unit of the substrate transport mechanism. Accordingly, the substrate being transported between the transfer section and the heating unit is precluded from being affected by the heat.

Further, the holding unit of the substrate transport mechanism can be cooled in the transfer section during heating of the substrate by the heating unit, thus avoiding a decrease in the throughput of substrate processing.

In this case, since the cooling unit is provided in the transfer section, the holding unit can be readily cooled without complicating the structure of the holding unit of the substrate transport mechanism.

A substrate processing apparatus according still another aspect of the present invention for performing a processing to a substrate comprises: a shelf having partition plates provided in a plurality of stages; and a plurality of thermal processing apparatuses arranged in the plurality of stages in the shelf, each of the plurality of thermal processing apparatuses comprising: a transfer section for receiving/transferring the substrate; a heating unit that performs a heat processing to the substrate; a substrate transport mechanism having a holding unit movable while holding the substrate, and transporting the substrate held by the holding unit between the heating unit and the transfer section; and a cooling unit provided in the transfer section for cooling the holding unit of the substrate transport mechanism.

In the substrate processing apparatus, the plurality of thermal processing apparatuses are arranged in the plurality of stages in the shelf having the partition plates provided in the plurality of stages. In each of the plurality of thermal processing apparatuses, the substrate is held by the holding unit of the substrate transport mechanism to be transported between the transfer section and the heating unit, and subjected to a heat processing by the heating unit. Moreover, the holding unit of the substrate transport mechanism is cooled by the cooling unit in the transfer section.

This suppresses the accumulation of heat in the holding unit of the substrate transport mechanism. Accordingly, the substrate being transported between the transfer section and the heating unit is precluded from being affected by the heat.

Further, the holding unit of the substrate transport mechanism can be cooled in the transfer section during heating of the substrate by the heating unit, thus avoiding a decrease in the throughput of substrate processing.

In this case, since the cooling unit is provided in the transfer section, the holding unit can be readily cooled without complicating the structure of the holding unit of the substrate transport mechanism.

Moreover, a large number of substrates can be processed by the plurality of thermal processing apparatuses in a short period, which leads to improved throughput of substrate processing.

A thermal processing method according to yet another aspect of the present invention for performing a thermal processing to a substrate comprises the steps of: transporting a substrate held by a holding unit of a substrate transport mechanism between a transfer section for receiving/transferring the substrate and a heating unit; performing a heat processing to the substrate in the heating unit; and cooling the holding unit of the substrate transport mechanism by a cooling unit provided in the transfer section.

In the thermal processing method, the substrate is held by the holding unit of the substrate transport mechanism to be transported between the transfer section and the heating unit, and subjected to a heat processing by the heating unit. Moreover, the holding unit of the substrate transport mechanism is cooled by the cooling unit in the transfer section.

This suppresses the accumulation of heat in the holding unit of the substrate transport mechanism. Accordingly, the substrate being transported between the transfer section and the heating unit is precluded from being affected by the heat.

In this case, since the cooling unit is provided in the transfer section, the holding unit can be readily cooled without complicating the structure of the holding unit of the substrate transport mechanism.

Further, the holding unit of the substrate transport mechanism can be cooled in the transfer section during heating of the substrate by the heating unit, thus avoiding a decrease in the throughput of substrate processing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Description will, hereinafter, be made of a substrate processing apparatus according to one embodiment of the present invention with reference to the drawings. It is noted that the substrate in the following description refers to a semiconductor wafer, a glass substrate for a liquid crystal display, a glass substrate for a PDP (Plasma Display Panel), a glass substrate for a photo-mask, a glass substrate for an optical disc, or the like.

Figure 1:
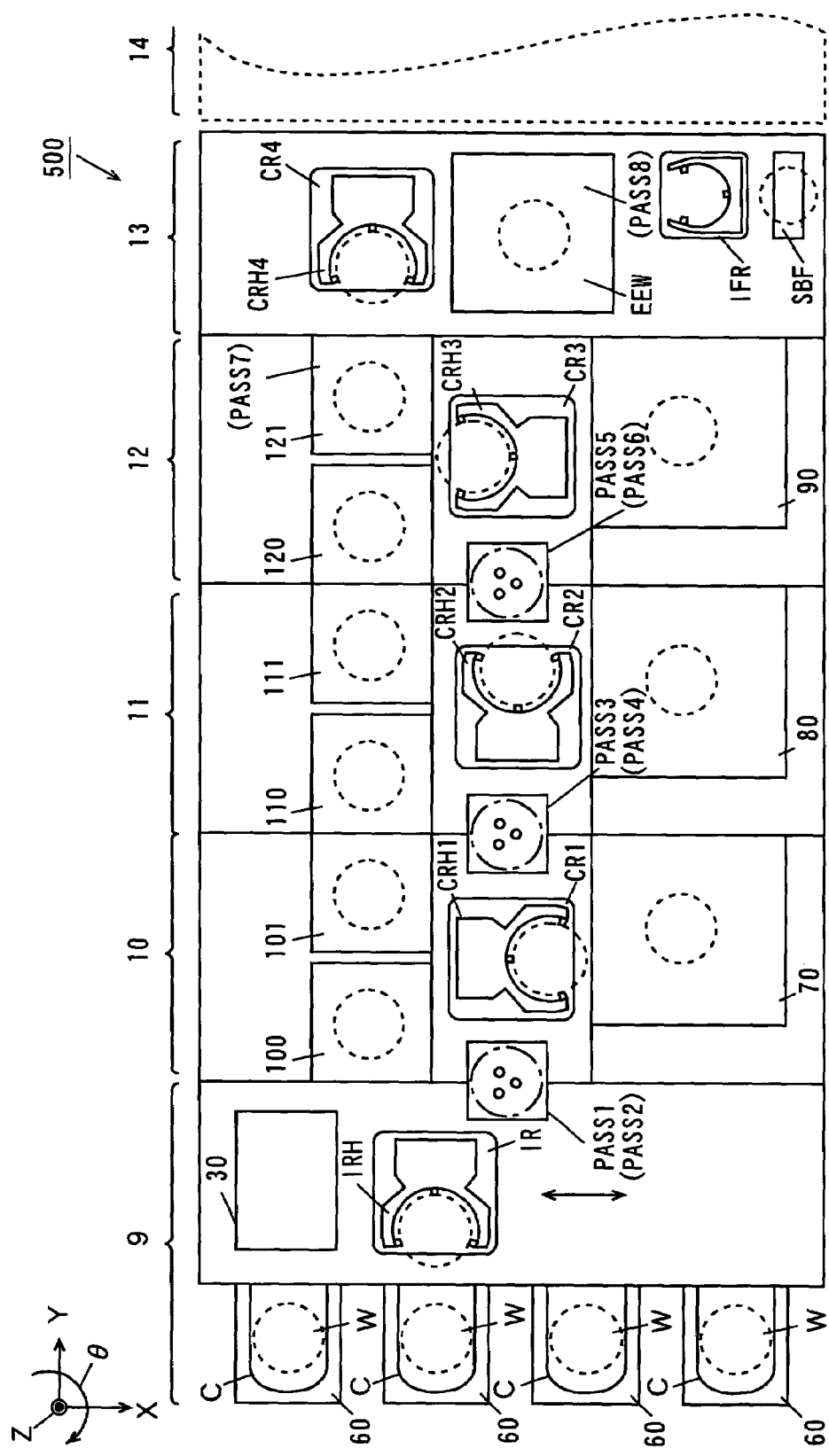
FIG. 1 is a plan view of a substrate processing apparatus according to one embodiment of the present invention.

FIG. 1 is a plan view of a substrate processing apparatus according to one embodiment of the present invention.

FIG. 1 and the following figures are each indicated by the arrows showing an X direction, Y direction, and Z direction perpendicular with one another, for clarity of positional relationship. The X direction and Y direction are perpendicular to each other in the horizontal plane, with the Z direction corresponding to the vertical direction. In each direction, the direction toward the arrow is defined as a +direction and the opposite direction as a −direction. The rotation direction around the Z direction is defined as a θ direction.

As shown in FIG. 1, the substrate processing apparatus 500 includes an indexer block 9, an anti-reflection film processing block 10, a resist film processing block 11, a developing block 12, and an interface block 13. A stepper unit 14 is arranged to neighbor the interface block 13.

The indexer block 9 includes a plurality of carrier mounting bases 60 and an indexer robot IR. The indexer robot IR has a hand IRH to receive/transfer a substrate W. The indexer robot 9 is also provided with a bake unit controller 30 for controlling the operations of thermal processing units described below. The anti-reflection film processing block 10 includes thermal processors 100, 101 for anti-reflection film, an anti-reflection film coater 70, and a first center robot CR1. The anti-reflection film coater 70 is provided opposite to the thermal processors 100, 101 for anti-reflection film with the first center robot CR 1 therebetween. The first center robot CR1 has a hand CRH1 to receive/transfer a substrate W.

The resist film processing block 11 includes thermal processors 110, 111 for resist film, a resist film coater 80, and a second center robot CR2. The resist film coater 80 is provided opposite to the thermal processors 110, 111 for resist film with the second center robot CR2 therebetween. The second center robot CR2 has a hand CRH2 to receive/transfer a substrate w.

The developing block 12 includes development thermal processors 120, 121, a developer 90, and a third center robot CR3. The developer 90 is provided opposite to the development thermal processors 120, 121 with the third center robot CR3 therebetween. The third center robot CR3 has a hand CRH3 to receive/transfer a substrate W.

The interface block 13 includes a fourth center robot CR4, a buffer SBF, an interface transport mechanism IFR, and an edge exposure unit EEW. The fourth center robot CR4 has a hand CRH4 to receive/transfer a substrate W. The interface transport mechanism IFR receives/transfers a substrate W between a substrate mounting unit PASS8 described later and the stepper unit 14.

In the substrate processing apparatus 500 according to the embodiment, the indexer block 9, anti-reflection film processing block 10, resist film processing block 11, developing block 12, and interface block 13 are serially arranged in this order along the Y direction.

Each of the indexer block 9, anti-reflection film processing block 10, resist film processing block 11, developing block 12, and interface block 13 will, hereafter, be referred to as a processing block.

The substrate processing apparatus 500 is provided with a main controller (not shown) for controlling the operation of each of the processing blocks.

Additionally, partition walls are provided between neighboring processing blocks. Each partition wall has two of substrate mounting units PASS1 to PASS6 arranged vertically closed to each other for receiving/transferring a substrate W between one processing block and another.

Moreover, the development thermal processor 121 in the developing block 12 is provided with the substrate mounting unit PASS7, and the edge exposure unit EEW in the interface block 13 is provided with the substrate mounting unit PASS8, as described later. Each of the substrate mounting units PASS1 to PASS8 is provided with a plurality of fixed support pins. Additionally, each of the substrate mounting units PASS1 to PASS8 is provided with an optical sensor (not shown) for detecting the presence/absence of a substrate W. This makes it possible to determine whether or not the substrate W is mounted on any of the substrate mounting units PASS1 to PASS8.

The substrate mounting units PASS1, PASS3, PASS5 are used for receiving/transferring a substrate W yet to be processed, while the substrate mounting units PASS2, PASS4, PASS6 are used for receiving/transferring a processed substrate W.

Brief description will now be made of the operation of the substrate processing apparatus 500 according to the embodiment.

A carrier C that houses a plurality of substrates W in multiple stages is installed on each of the carrier mounting bases 60 in the indexer block 9. The indexer robot IR takes out an unprocessed substrate W housed within the carrier C using the hand IRH for receiving/transferring a substrate W. Then, the indexer robot IR rotates in the ±θ direction while moving in the ±X direction to transfer the unprocessed substrate W onto the substrate mounting unit PASS1.

While FOUPs (Front Opening Unified Pods) are adopted as the carriers C according to the embodiment, SMIF (Standard Mechanical Inter Face) pods and OCs (Open Cassettes) which exposes the housed substrates W to outside air may, for example, be used without limited to those described herein.

Moreover, linear motion type transport robots which advance/withdraw their hands by sliding them linearly to the substrates W are used for the indexer robot IR, first to fourth center robots CR1 to CR4, and interface transport mechanism IFR, respectively; however, multi-joint type transport robots which advance/withdraw their hands linearly by moving their joints may also be used without limited to those described herein.

The unprocessed substrate W transferred on the substrate mounting unit PASS1 is received by the hand CRH1 of the first center robot CR1 in the anti-reflection film processing block 10. The first center robot CR1 carries the substrate W into the anti-reflection film coater 70. In the anti-reflection film coater 70, in order to reduce standing waves and a halation which may be generated during exposure, an anti-reflection film is coated beneath a photoresist film by a coating unit BARC described later.

After that, the first center robot CR1 takes out the substrate W from the anti-reflection film coater 70, and carries the substrate W into the thermal processors 100, 101 for anti-reflection film. After the substrate W is subjected to a predetermined processing in the thermal processors 100, 101 for anti-reflection film, the first center robot CR1 takes out the substrate W from there to transfer it onto the substrate mounting unit PASS3.

The substrate W transferred on the substrate mounting unit PASS3 is received by the hand CRH2 of the second center robot CR2 in the resist film processing block 11. The second center robot CR2 carries the substrate W into the resist film coater 80. In the resist film coater 80, a photoresist film is coated on the substrate W with the anti-reflection film coated thereon by a coating unit RES described later. The second center robot CR2 then takes out the substrate W from the resist film coater 80 to carry it into the thermal processors 110, 111 for resist film. After the substrate W is subjected to a predetermined processing in the thermal processors 110, 111 for resist film, the second center robot CR2 takes out the substrate W from there to transfer it onto the substrate mounting unit PASS5.

The substrate W transferred on the substrate mounting unit PASS5 is received by the hand CRH3 of the third center robot CR3 in the developing block 12. The third center robot CR3 transfers the substrate W onto the substrate mounting unit PASS7. The substrate W transferred on the substrate mounting unit PASS7 is received by the hand CRH4 of the fourth center robot CR4 in the interface block 13. The fourth center robot CR4 carries the substrate W into the edge exposure unit EEW. After the substrate W is subjected to a predetermined processing in the edge exposure unit EEW, the fourth center robot CR4 takes out the substrate W from there to transfer it onto the substrate mounting unit PASS8 provided under the edge exposure unit EEW.

The substrate W transferred on the substrate mounting unit PASS8 is received by the interface transport mechanism IFR. The interface transport mechanism IFR carries the substrate W into the stepper unit 14. The substrate W is subjected to a predetermined processing in the stepper unit 14. The interface transport mechanism IFR subsequently receives the substrate W from the stepper unit 14 to transfer it onto the substrate mounting unit PASS8 provided under the edge exposure unit EEW.

The substrate W transferred on the substrate mounting unit PASS8 is received by the hand CRH4 of the fourth center robot CR4 in the interface block 13. The fourth center robot CR4 carries the substrate W into the development thermal processor 121. The substrate W is subjected to a predetermined processing in the development thermal processor 121. Then, the fourth center robot CR4 takes out the substrate W from there to transfer it onto the substrate mounting unit PASS7.

The substrate W transferred on the substrate mounting unit PASS7 is received by the hand CRH3 of the third center robot CR3 in the developing block 12. The third center robot CR3 carries the substrate W into the developer 90. The exposed substrate W is subjected to development in the developer 90. The third center robot CR3 subsequently takes out the substrate W from the developer 90 to carry it into the development thermal processor 120. After the substrate W is subjected to a predetermined processing in the development thermal processor 120, the third center robot CR3 takes out the substrate W from the development thermal processor 120, to transfer it onto the substrate mounting unit PASS6 provided in the resist film processing block 11.

The substrate W transferred on the substrate mounting unit PASS6 is transferred onto the substrate mounting unit PASS4 by the second center robot CR2 in the resist film processing block 11. The substrate W transferred on the substrate mounting unit PASS4 is transferred onto the substrate mounting unit PASS2 by the first center robot CR1 in the anti-reflection film processing block 10.

The substrate W transferred on the substrate mounting unit PASS2 is housed inside a carrier C by the indexer robot IR in the indexer block 9.

Figure 2:
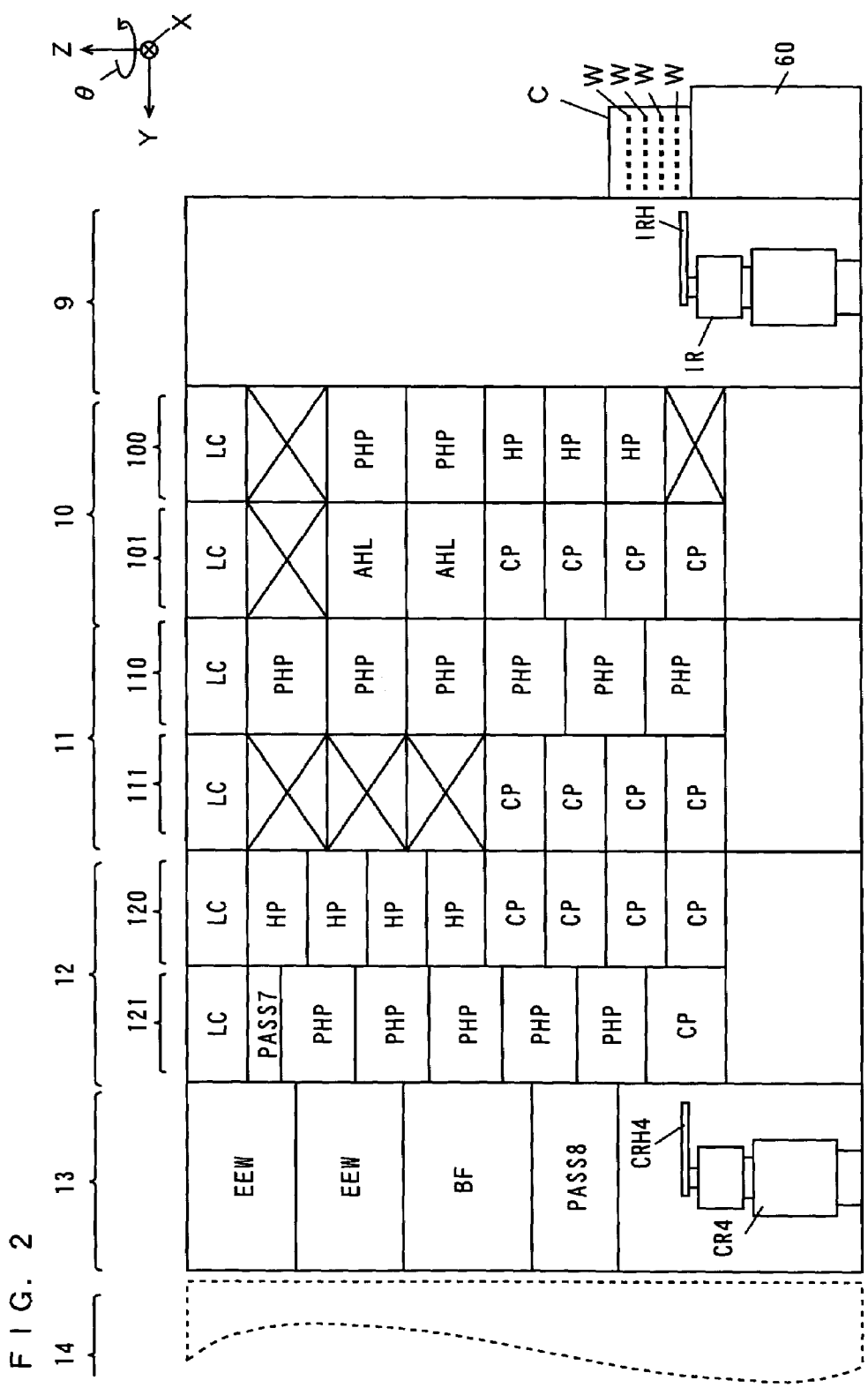
FIG. 2 is a side view of the substrate processing apparatus of FIG. 1 taken from the −X direction.

Now refer to FIG. 2, which is a side view of the substrate processing apparatus 500 of FIG. 1 taken from the −X direction.

A carrier C that houses substrates W is mounted on the carrier mounting base 60 in the indexer block 9. The hand IRH of the indexer robot IR rotates in the ±θ direction or advances/withdraws in the ±Y direction to receive a substrate W inside the carrier C.

In the thermal processor 100 for anti-reflection film of the anti-reflection film processing block 10, two thermal processing units PHP with transfer sections (hereinafter simply referred to as thermal processors) and three hot plates HP are vertically stacked, while in the thermal processor 101 for anti-reflection film, two adhesion agent coaters AHL and four cooling plates CP are vertically stacked. In the thermal processors 100, 101 for anti-reflection film, respectively, local controllers LC are further arranged on top for controlling the temperatures of the thermal processing units PHP, hot plates HP, adhesion agent coaters, and cooling plates CP.

In the thermal processor 110 for resist film of the resist film processing block 11, six thermal processing units PHP are vertically stacked, while in the thermal processor 111 for resist film, four cooling plates CP are vertically stacked. In the thermal processors 110, 111 for resist film, respectively, local controllers LC are further arranged on top for controlling the temperatures of the thermal processing units PHP and cooling plates CP.

In the development thermal processor 120 of the developing block 12, four hot plates HP and four cooling plates CP are vertically stacked, while in the development thermal processor 121, the substrate mounting unit PASS7, five thermal processing units PHP, and a cooling plate CP are vertically stacked. In the development thermal processors 120, 121, respectively, local controllers LC are arranged on top for controlling the temperatures of the thermal processing units PHP, hot plates HP, and cooling plate CP.

In the interface block 13, two edge exposures EEW, a buffer BF, and the substrate mounting unit PASS8 are vertically stacked with the arrangement of the fourth center robot CR4 and interface transport mechanism IFR (not shown).

Figure 3:
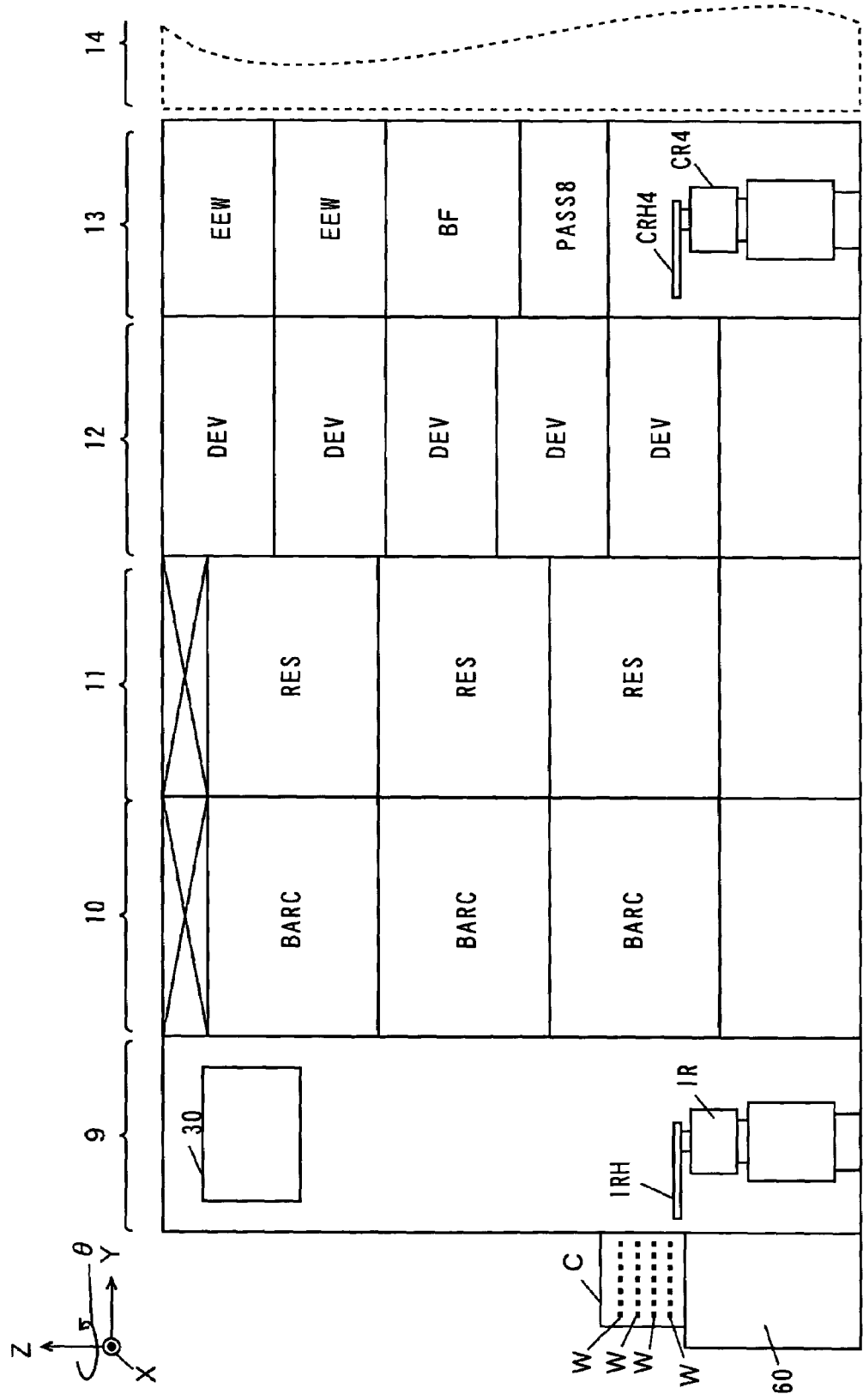
FIG. 3 is a side view of the substrate processing apparatus of FIG. 1 taken from the +X direction.

FIG. 3 is a side view of the substrate processing apparatus 500 of FIG. 1 taken from the +X direction.

A bake unit controller 30 is arranged at an upper part of the indexer block 9. In the anti-reflection film coater 70, three coating units BARC are vertically stacked. In the resist film coater 80, three coating units RES are vertically stacked. In the developer 90, five developing units DEV are vertically stacked.

Figure 4:
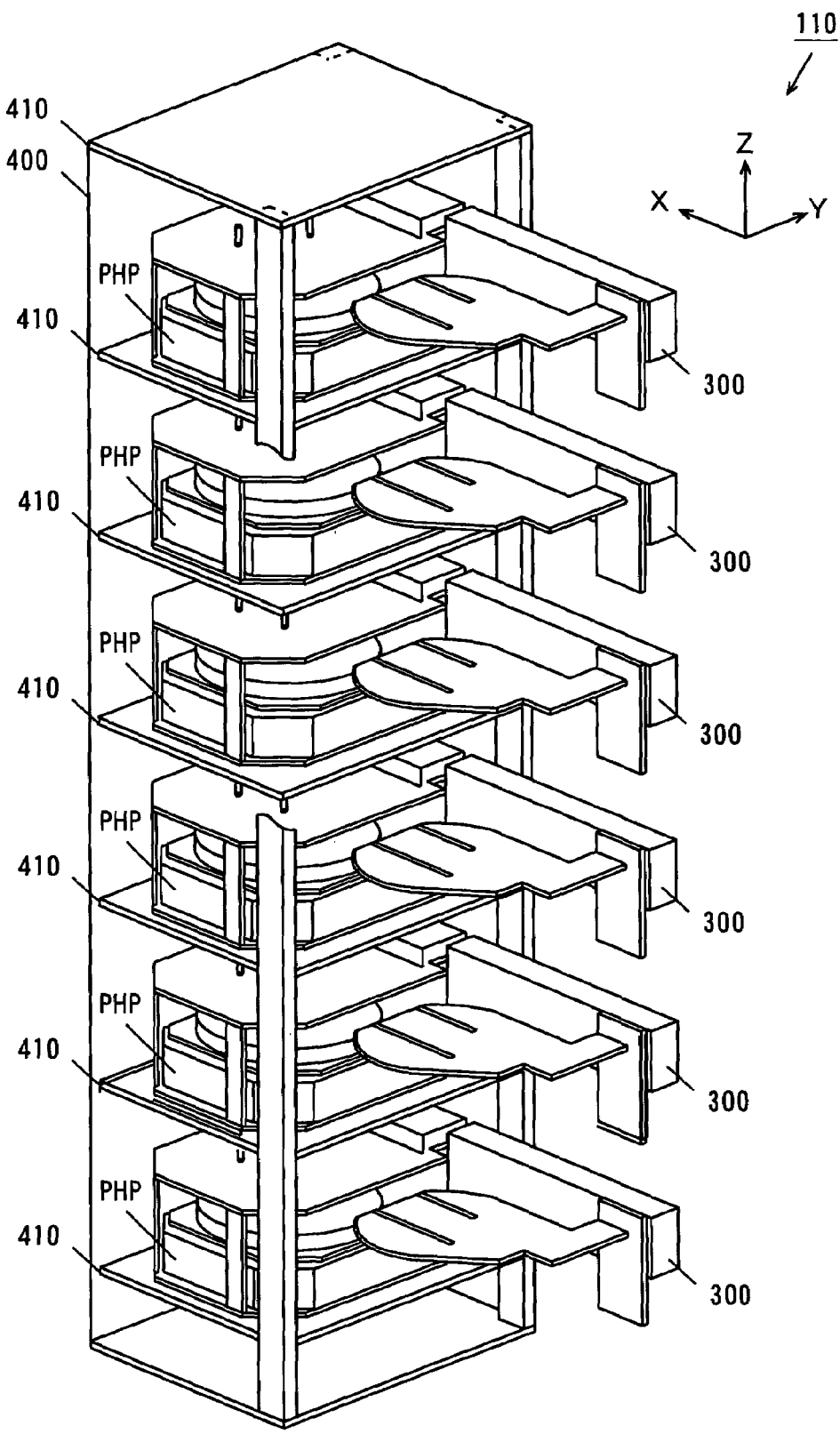
FIG. 4 is an external perspective view showing a thermal processor for resist film.

FIG. 4 is an external perspective view showing the thermal processor 110 for resist film.

The thermal processor 110 for resist film shown in FIG. 4 is composed of a bake box 400 and six thermal processing units PHP. The six thermal processing units PHP are housed in the respective six spaces formed by box partition plates 410 in the bake box 400. This allows the six thermal processing units PHP to be vertically stacked in the bake box 400. Additionally, a local transport mechanism 300 is provided to each of the thermal processing units PHP. The local transport mechanism 300 will later be detailed.

Figure 5:
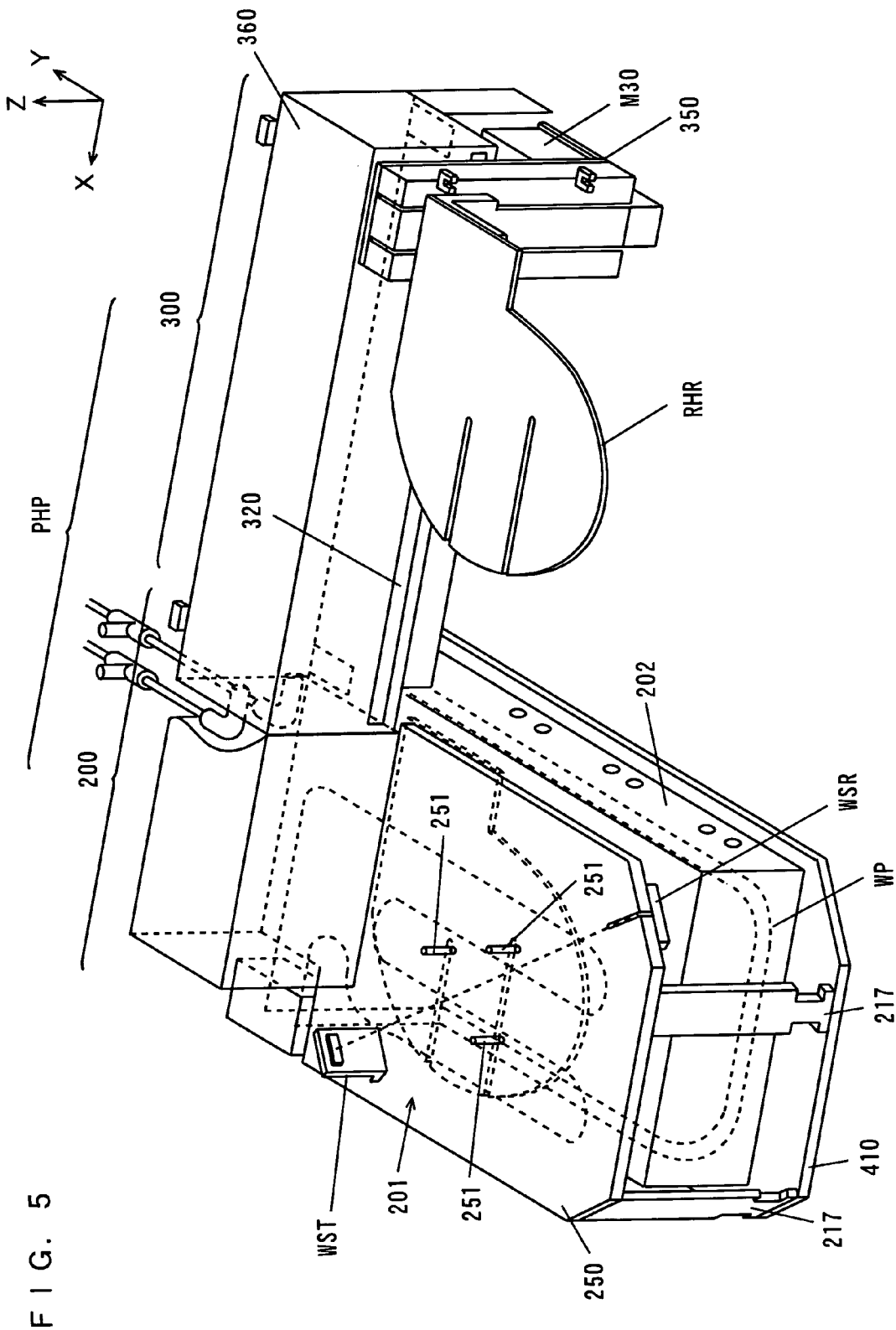
FIG. 5 is an external perspective view of a thermal processing unit forming the thermal processor for resist film of FIG. 4.
Figure 6:
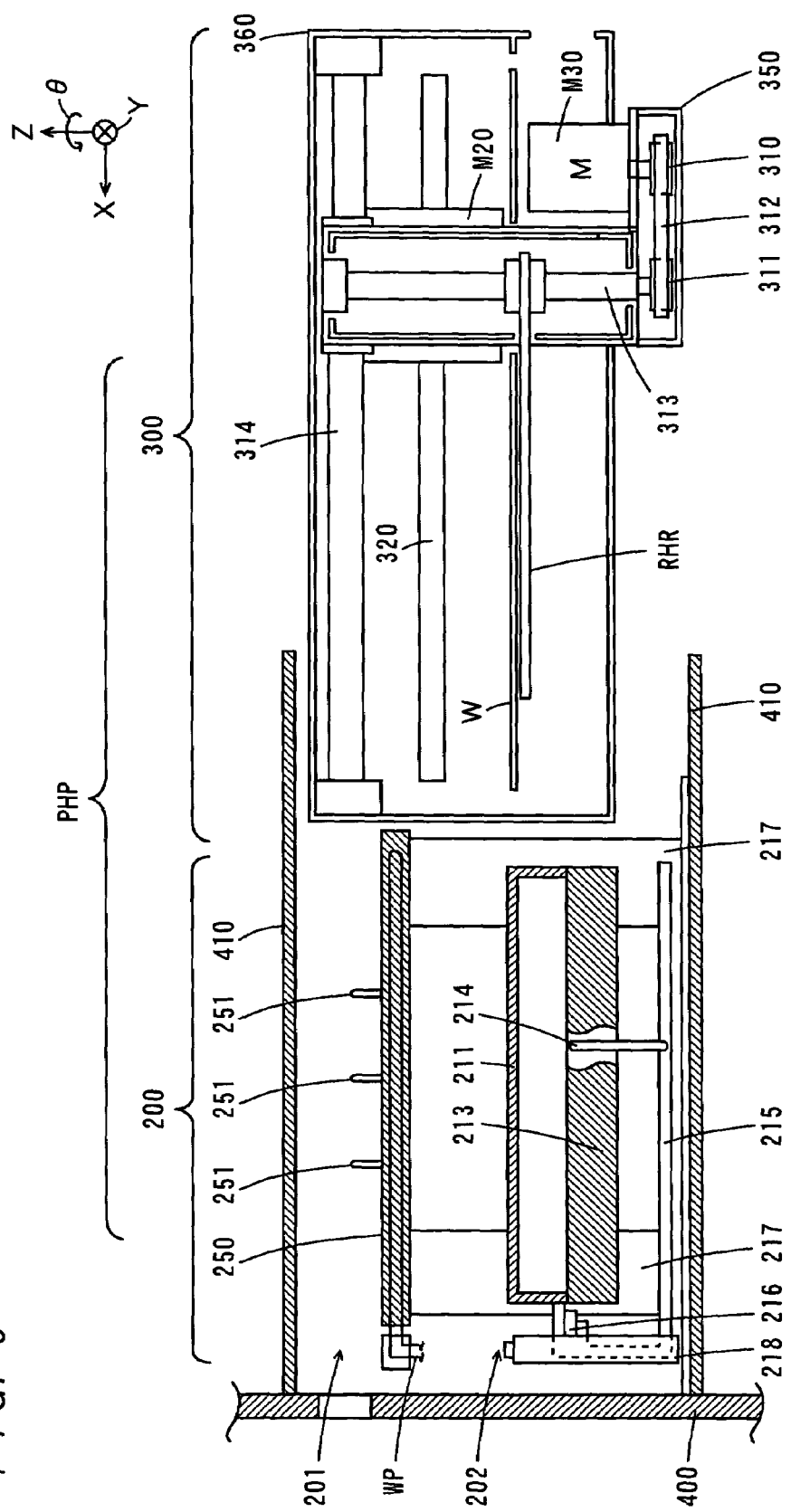
FIG. 6 is a sectional view of the thermal processing unit of FIG. 5.

FIG. 5 is an external perspective view of a thermal processing unit PHP forming the thermal processor 110 for resist film of FIG. 4, and FIG. 6 is a sectional view of the thermal processing unit PHP of FIG. 5.

As shown in FIGS. 5 and 6, the thermal processing unit PHP is mainly composed of a thermal processor 200 and a local transport mechanism 300. The thermal processor 200 includes vertically arranged transfer section 201 and heating device 202.

The transfer section 201 includes a cooling plate 250, a plurality of fixed support pins 251, a substrate detecting sensor WST, WSR, and a water-cooled pipe WP. The heating device 202 includes a top cover 211, a heating plate 213, a plurality of movable support pins 214, a support plate 215, a top cover holding member 216, a support member 217, and a top cover open/close drive 218.

The cooling plate 250 and heating plate 213 are vertically supported by the support member 217 at a predetermined distance. This allows the cooling plate 250 to shield between the transfer section 201 and the heating device 202.

Moreover, the water-cooled pipe WP is provided inside the cooling plate 250, so that a refrigerant is circulated inside the water-cooled pipe WP to adjust the temperature of the cooing plate 250. The cooling plate 250 is provided with the plurality of fixed support pins 251 projecting upward.

The heating plate 213 in the heating device 202 is provided with a plurality of through holes where the plurality of movable support pins 214 are provided. The movable support pins 214 are attached to the support plate 215.

Further, the top cover 211 is held on the heating plate 213 by the top cover holding member 216. The support plate 215 and top cover holding member 216 simultaneously move up and down in the ±Z direction by the function of the top cover open/close drive 218.

The local transport mechanism 300 includes pulleys 310, 311, a belt 312, a ±Z direction feed shaft 313, a ±X direction feed shaft 314, a slide rail 320, casings 350, 360, a local transport hand RHR, a ±X-axial transport motor M20, and a ±Z-axial transport motor M30.

Components such as the pulleys 310, 311, belt 312, and ±Z direction feed shaft 313, for moving the local transport hand RHR in the ±Z direction, are housed inside the casing 350 in the local transport mechanism 300, whereas components such as the +X direction feed shaft 314 and slide rail 320, for moving the local transport hand RHR and casing 350 in the +X direction, are housed inside the casing 360 in the local transport mechanism 300.

As the ±Z-axial transport motor M30 rotates, the ±Z direction feed shaft 313 also rotates via the pulleys 310, 311 and belt 312. This causes the local transport hand RHR to ascend/descend in the ±Z direction.

Additionally, as the ±X-axial transport motor M30 rotates, the ±X direction feed shaft 314 also rotates. This causes the local transport hand RHR to advance/withdraw in the ±X direction with the casing 350.

The local transport hand RHR is provided with a slit in order to avoid interference with the fixed support pins 251 and movable support pins 214.

The following description is made of a flowchart by the bake unit controller 30 for controlling the operation of the thermal processing unit PHP, and states after the respective processing operations are performed using the operation diagrams.

Figure 7:
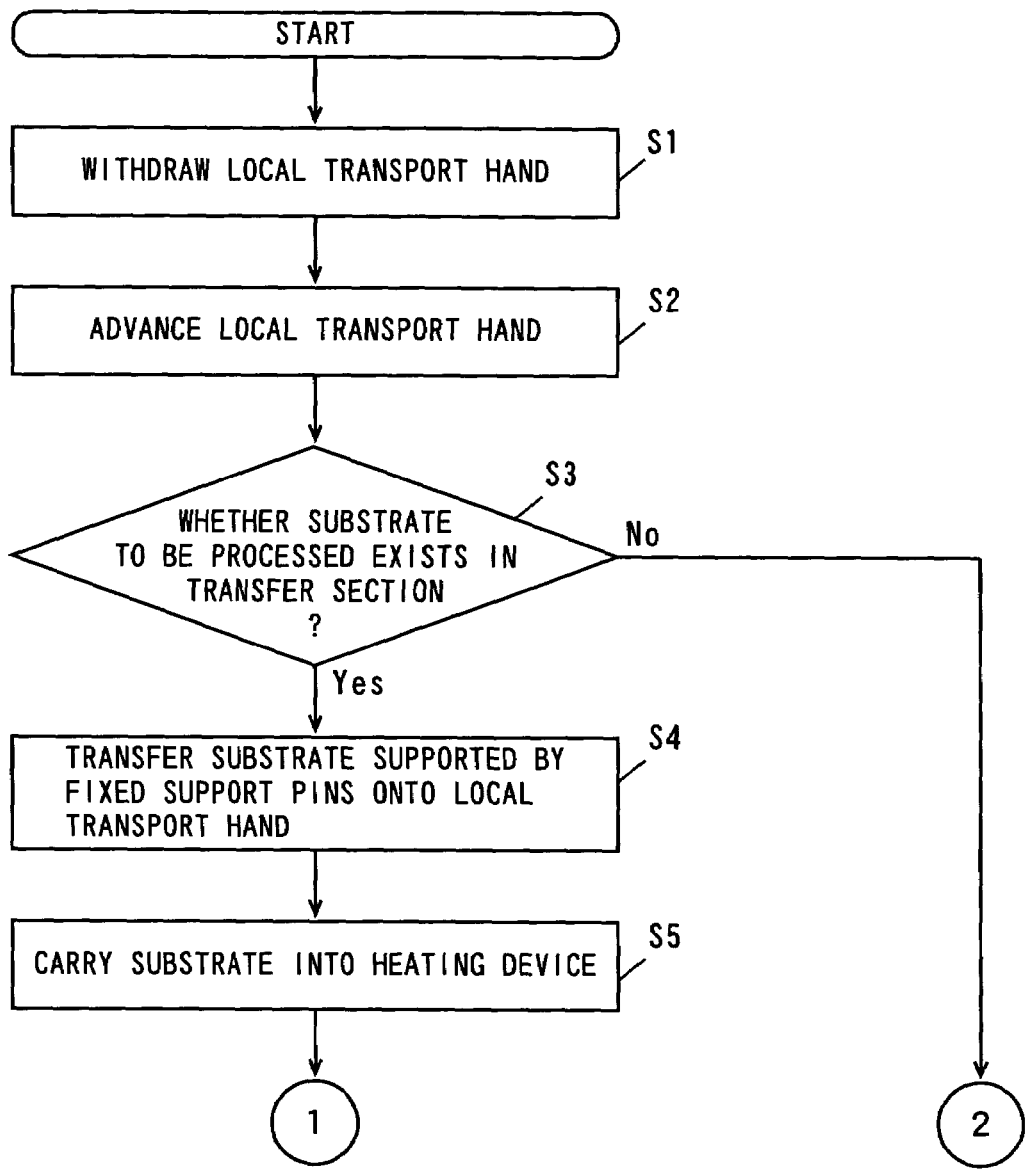
FIG. 7 is a flowchart showing the operation of a bake unit controller for controlling the operation of the thermal processing unit.
Figure 8:
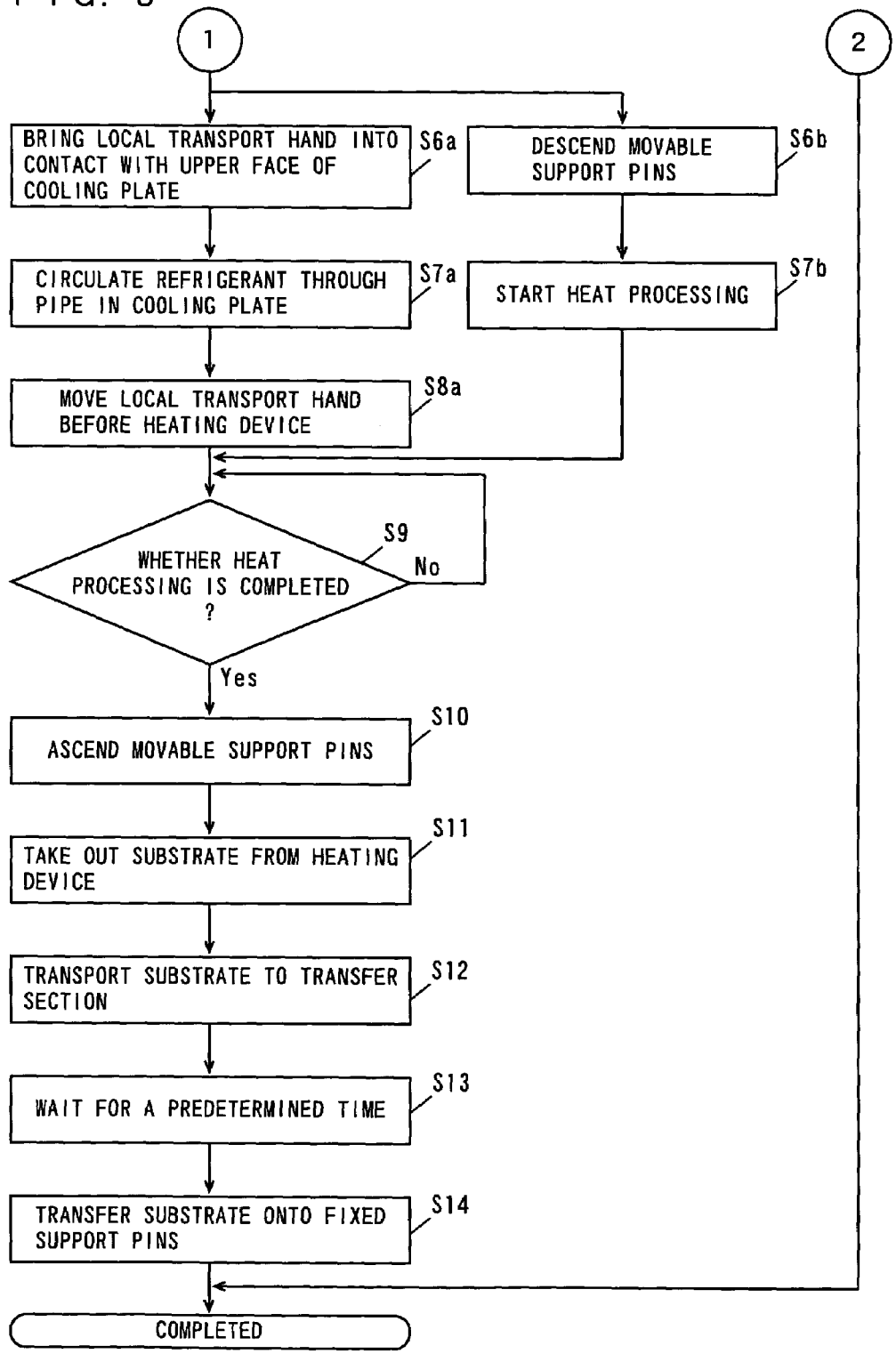
FIG. 8 is a flowchart showing the operation of a bake unit controller for controlling the operation of the thermal processing unit.
Figure 9:
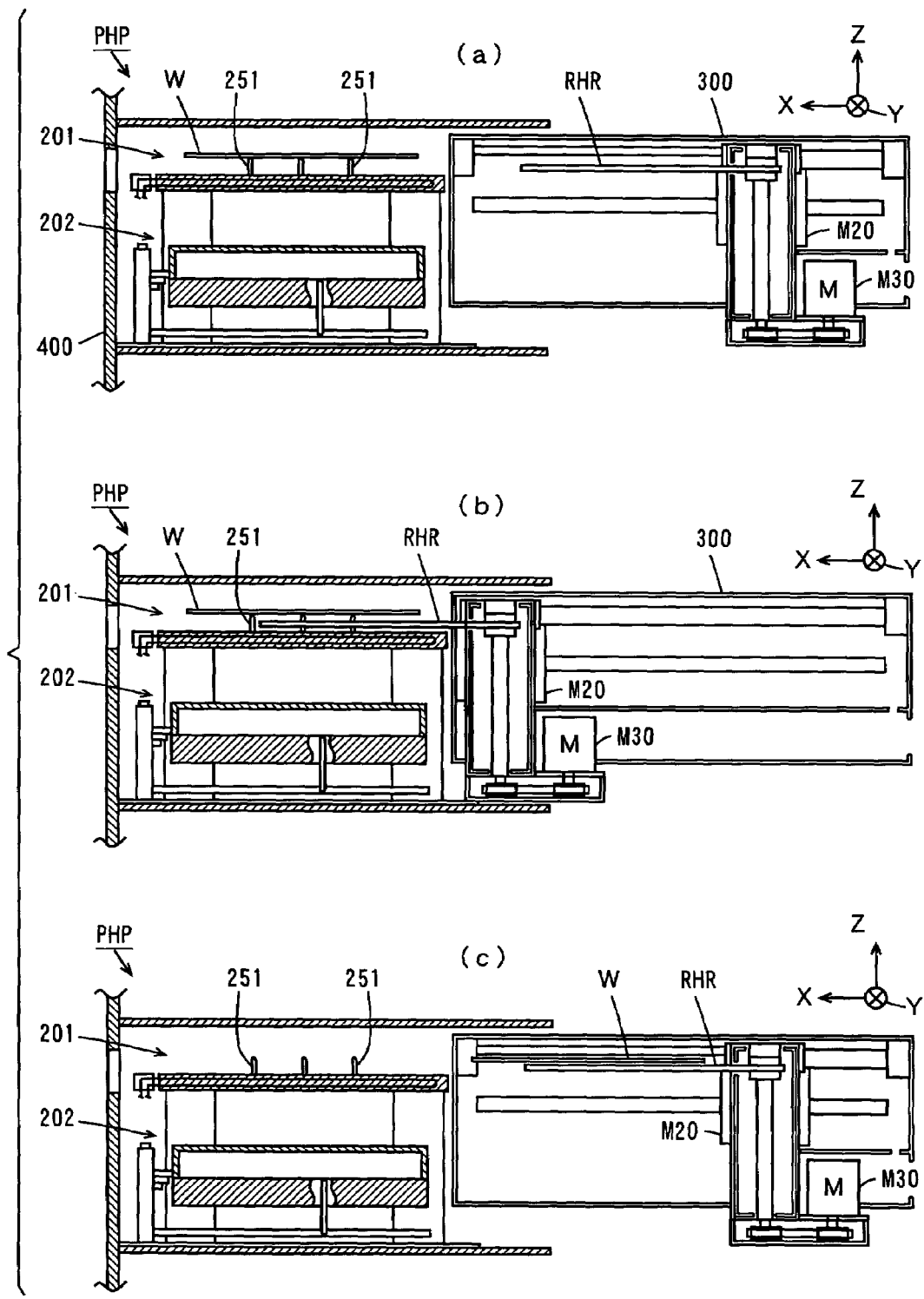
FIG. 9 is a sectional view showing the inside of the thermal processing unit during each of the processings by the bake unit controller of FIGS. 7 and 8.
Figure 10:
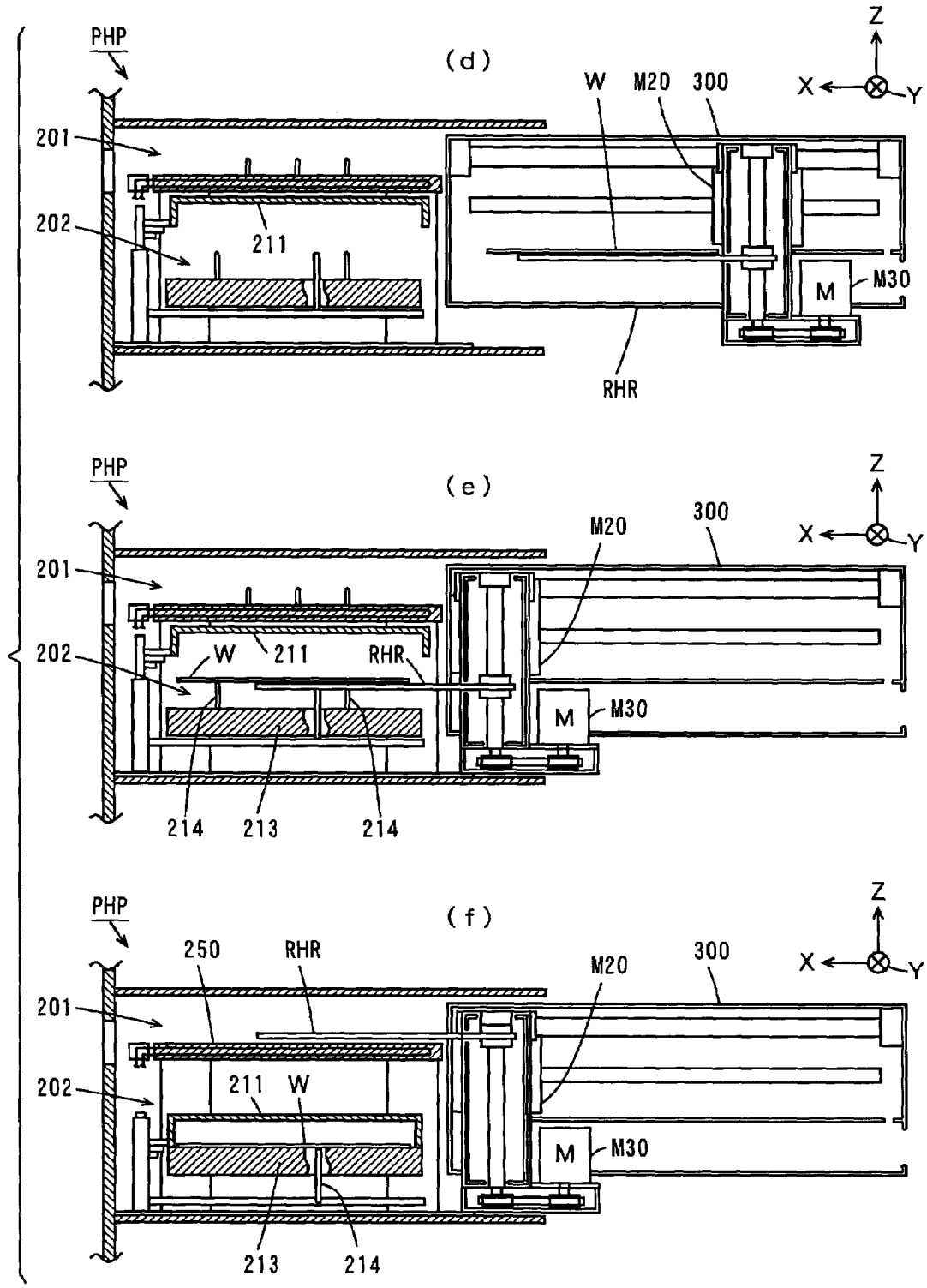
FIG. 10 is a sectional view showing the inside of the thermal processing unit during each of the processings by the bake unit controller of FIGS. 7 and 8.
Figure 11:
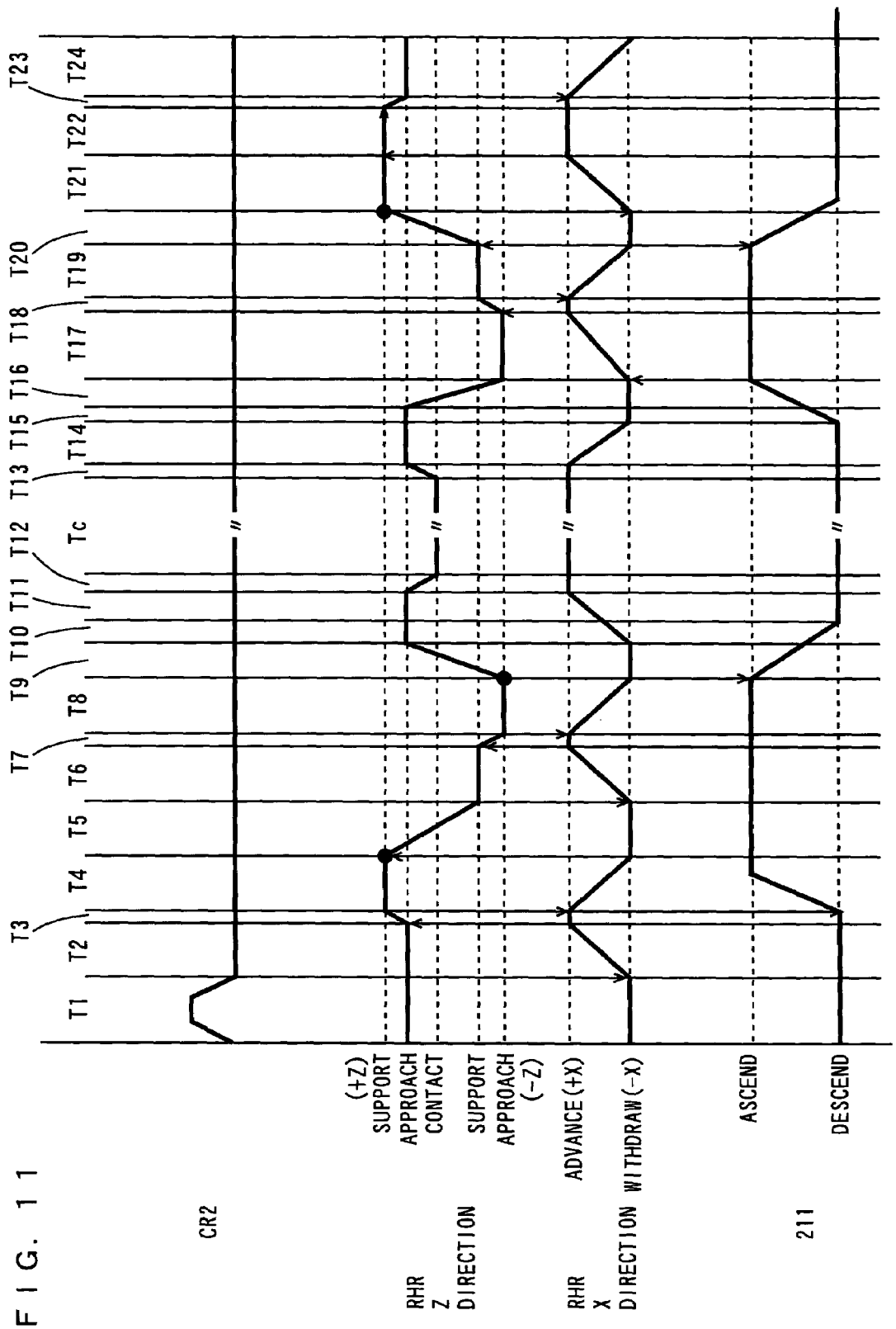
FIG. 11 is a sequence diagram showing the operations of a second center robot, a local transport hand, and a top cover.

FIGS. 7 and 8 are flowcharts showing the operation of the bake unit controller 30 for controlling the operation of the thermal processing unit PHP, and FIGS. 9 and 10 are sectional views showing the inside of the thermal processing unit PHP during each processing by the bake unit controller 30 of FIGS. 7 and 8. Additionally, FIG. 11 is a sequence diagram showing the operations of the center robot CR2, local transport hand RHR, and top cover 211. Note that a main controller which ranks higher than the bake unit controller 30 (not shown) is provided.

Initially, the bake unit controller 30 instructs the local transport mechanism 300 to withdraw the local transport hand RHR from the transfer section 201 in the −X direction (Step S1).

Then, during time period T1 of FIG. 11, the bake unit controller 30 allows the second center robot CR2 of FIG. 1 to advance to the transfer section 201 in the thermal processing unit PHP with the substrate W being held by the hand CRH2. After that, the bake unit controller 30 allows the hand CRH2 of the second center robot CR2 to descend and transfer the substrate W onto the fixed support pins 251 in the thermal processing unit PHP (during the time period T1 of FIG. 11). Then, the second center robot CR2 withdraws from the transfer section 201 in the thermal processing unit PHP.

In this case, the substrate W is being held by the fixed support pins 251 in the thermal processing unit PHP, as shown in FIG. 9(a).

During time period T2 of FIG. 11, the bake unit controller 30 instructs the local transport mechanism 300 to advance the local transport hand RHR to the transfer section 201 (Step S2). This causes the ±X-axial transport motor M20 in the local transport mechanism 300 to rotate, so that the local transport hand RHR advances in the +X direction.

The bake unit controller 30 subsequently determines whether or not the substrate W to be processed exists in the transfer section 201 (Step S3). In this case, the bake unit controller 30 determines whether or not the substrate W to be processed exists in the transfer section 201 based on a signal from the substrate detecting sensor WST, WSR shown in FIG. 5. Where determining that the substrate W to be processed does not exist in the transfer section 201, the bake unit controller 30 completes the processing.

On the other hand, where determining that the substrate W to be processed does exist in the transfer section 201, the bake unit controller 30 instructs the local transport mechanism 300 to transfer the substrate W supported by the fixed support pins 251 onto the local transport hand RHR (Step S4). In this case, during the time period T2 of FIG. 11, the ±X-axial transport motor M20 in the local transport mechanism 300 rotates, so that the local transport hand RHR advances in the +X direction. This causes the local transport hand RHR to advance to the rear side of the substrate W supported by the fixed support pins 251 in the transfer section 201, as shown in FIG. 9(b).

Further, during time period T3 of FIG. 11, the ±Z-axial transport motor M30 rotates, so that the local transport hand RHR slightly ascends in the +Z direction in order to support the substrate W. Then, as shown in FIG. 9(c), the local transport hand RHR withdraws in the −X direction from the transfer section 201 while supporting the rear side of the substrate W (during the time period T4 of FIG. 11).

The bake unit controller 30 subsequently instructs the local transport mechanism 300 to carry the substrate W into the heating device 202 (Step S5). In this case, the ±Z-axial transport motor M30 in the local transport mechanism 300 rotates, so that during time period T5 of FIG. 11, the local transport hand RHR descends in the −Z direction while holding the substrate W, as shown in FIG. 10(d). At the time, the top cover 211 of the heating device 202 is opened during this processing.

Then, during time period T6 of FIG. 11, the ±X-axial transport motor M20 in the local transport mechanism 300 rotates, so that the local transport hand RHR advances in the +X direction. At subsequent time period T7 of FIG. 11, the ±Z-axial transport motor M30 in the local transport mechanism 300 slightly rotates, so that the local transport hand RHR slightly descends in the −Z direction. As shown in FIG. 10(e), the local transport hand RHR transfers the substrate W onto the movable support pins 214.

The bake unit controller 30 subsequently operates in parallel. In FIG. 8, processings the bake unit controller 30 instructs the local transport mechanism 300 to perform are indicated by "a", while the other processings the bake unit controller 30 instructs the heating device 202 to perform are indicated by "b".

The bake unit controller 30 instructs the local transport mechanism 300 to bring the local transport hand RHR into contact with an upper face of the cooling plate 250 (Step S6a). Meanwhile, the bake unit controller 30 instructs the heating device 202 to allow the movable support pins 214 to descend after withdrawing the local transport hand RHR in the −X direction (Step S6b). This results in the substrate W being placed on the heating plate 213. At the same time, the top cover 211 is closed.

Then, the bake unit controller 30 allows the refrigerant to circulate through the pipe in the cooling plate 250 (Step S7a). Meanwhile, the bake unit controller 30 instructs the heating device 202 to start a thermal processing (Step S7b). This causes the heating plate 213 to be heated for the thermal processing.

In this case, the local transport hand RHR withdraws in the −X direction during time period T8, and ascends in the +Z direction during time period T9. Further, as shown in FIG. 10(f), it advances in the +X direction during time period T10, T11, slightly descends in the −Z direction during time period T12 to come in contact with the upper face of the cooling plate 250. Thus, during time period Tc of FIG. 11, the local transport hand RHR is cooled by the cooling plate 250. After the predetermined time period Tc has elapsed, the bake unit controller 30 instructs the local transport mechanism 300 to move the local transport hand RHR before the heating device 202 (Step S8a). The time period Tc will later be detailed. In this way, the parallel processing of the bake unit controller 30 is completed.

The bake unit controller 30 subsequently determines whether or not the thermal processing by the heating device 202 is completed (Step S9). Where determining that the thermal processing is not completed, the bake unit controller 30 returns to Step S9 and waits.

On the other hand, where determining that the thermal processing by the heating device is completed, the bake unit controller 30 instructs the heating device 202 to allow the movable support pins 214 to ascend (Step S10). In this case, during time period T13 of FIG. 11, the local transport hand RHR slightly ascends in the +Z direction, and during time period T14, it withdraws in the −X direction. During time periods T15, T16 of FIG. 11, the top cover 211 is opened.

The bake unit controller 30 then instructs the local transport mechanism 300 to take out the substrate W from the heating device 202 (Step S11). In this case, during time period T17, the ±X-axial transport motor M20 in the local transport mechanism 300 rotates, so that the local transport hand RHR moves in the +X direction to advance to the rear side of the substrate W supported by the movable support pins 214. Then, during time period T18 of FIG. 11, the ±Z-axial transport motor M30 in the local transport mechanism 300 rotates, so that the local transport hand RHR moves in the +Z direction to receive the substrate W.

The bake unit controller 30 subsequently instructs the local transport mechanism 300 to transport the substrate W to the transfer section 201 (Step S12). In this case, during time period T19, the ±X-axial transport motor M20 in the local transport mechanism 300 rotates, so that the local transport hand RHR moves in the −X direction, and then during time period T20 of FIG. 11, the ±Z-axial transport motor M30 in the local transport mechanism 30 rotates, so that the local transport hand RHR moves in the +Z direction, and lastly, during time period T21 of FIG. 11, the ±X-axial transport motor M20 in the local transport mechanism 300 rotates, so that the local transport hand RHR moves in the +X direction, which allows the substrate W to be transported to the transfer section 201.

After that, the bake unit controller 30 waits, during time period T22 of FIG. 11, for a predetermined time (Step S13). After the predetermined time has elapsed, the bake unit controller 30 instructs the local transport mechanism 300 to transfer the substrate W onto the fixed support pins 251 (Step S14). In this case, during time period T23 of FIG. 11, the ±Z-axial transport motor M30 in the local transport mechanism 300 rotates, so that the local transport hand RHR descends in the −Z direction. This causes the substrate W to be placed on the fixed support pins 251. Then, during time period T24, the local transport hand RHR withdraws in the −X direction.

In this case, the substrate W after the thermal processing is supported by the fixed support pins 251, as shown in FIG. 9(a).

Now, the time period Tc will be described. The time period Tc can be expressed by the following equation:

$$Tc = Tp - 15 \quad Tp \geq 20$$

where Tc represents the time (sec) in which the local transport hand RHR is in contact with the cooling plate 250, and Tp represents the time (sec) in which the thermal processing is performed for the substrate W. In the case of Tp<20, it is assumed that Tp=20.

Since Tp is normally set to approximately 60 (sec), it follows that Tc is approximately 45 (sec). In this way, cooling of the local transport hand RHR is performed during the thermal processing without affecting the throughput.

As described above, in the thermal processing unit PHP according to the embodiment, it is possible to cool the local transport hand RHR during the heating time of the substrate W in which the local transport hand RHR is not used, thus avoiding a decrease in the throughput. Accordingly, even when the heated substrate W is repeatedly transported, heat transmitted from the substrate W to the local transport hand RHR can be removed. This allows the temperature of the local transport hand RHR to be maintained constant, thereby precluding the substrate W from being affected by the heat.

Moreover, since the cooling plate 250 is arranged between the transfer section 201 and the heating device 202, upward heat transfer from the heating device 202 is shielded. This precludes the substrate W either on standby or after the processing from being affected by heat atmosphere in the heating device 202. Additionally, the influence of heat on the other heating processing units PHP arranged above can be suppressed. Furthermore, since the local transport hand RHR is brought in contact with the cooling plate 250, cooling of the local transport hand RHR can be forced, thus allowing control of the time until the cooling is started, after the thermal processing of the substrate W. Consequently, potential adverse influence on the evenness of the temperature of the substrate W caused by such disturbances as heat can be suppressed. As a result, the arrangement of the plurality of thermal processing units where they are stacked in multiple stages is made possible.

In the thermal processing apparatus according to the present invention, since the thermal processors are partitioned by the respective partition plates 410 in the bake box 400, the substrate W either on standby or after processed can be precluded from being affected by the heat from the thermal processors.

In the embodiment according to the present invention, the heating plate 213 corresponds to a heating unit; the transfer section 201 corresponds to a transfer section; the local transport hand RHR corresponds to a holding unit; the local transport mechanism 300 corresponds to a substrate transport mechanism; the substrate W corresponds to a substrate; the cooling plate 250 corresponds to a cooling unit; the bake unit controller 30 corresponds to a control device; the plurality of fixed support pins 251 correspond to a support member or a plurality of support pins; the water-cooled pipe WP corresponds to a cooling circulation path; the plurality of movable support pins 214 correspond to a movable support member; the substrate detecting sensor WST, WSR correspond to a detection device; the bake box 300 corresponds to a shelf; the partition plates 410 correspond to partition plates; and the first to third center robots CR1 to CR3 correspond to a substrate transport device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A thermal processing apparatus for performing a thermal processing to a substrate, the thermal processing apparatus being used in a substrate processing apparatus including said thermal processing apparatus and a substrate transport device that carries/takes out the substrate into/from said thermal processing apparatus, said thermal processing apparatus comprising:

a transfer section for receiving/transferring a substrate from/to said substrate transport device;

a heating unit that performs a heat processing to the substrate;

a substrate transport mechanism having a holding unit movable while holding the substrate, and transporting the substrate held by said holding unit between said heating unit and said transfer section;

a cooling unit provided in said transfer section for cooling said holding unit of said substrate transport mechanism; and a control device that controls said substrate transport mechanism so that said holding unit is cooled by coming into contact with said cooling unit during the heat processing of the substrate by said heating unit.

2. The thermal processing apparatus according to claim 1, wherein said heating unit and said cooling unit are arranged to be vertically stacked.

3. The thermal processing apparatus according to claim 1, wherein said cooling unit includes a cooling plate with which said holding unit can come into contact.

4. The thermal processing apparatus according to claim 3, wherein said cooling plate has a cooling circulation path through which a refrigerant is circulated.

5. The thermal processing apparatus according to claim 3, wherein said cooling plate is arranged between said transfer section and said heating unit.

6. The thermal processing apparatus according to claim 3, wherein said control device controls said substrate transport mechanism so that said holding unit comes into contact with said cooling plate during cooling of said holding unit.

7. The thermal processing apparatus according to claim 3, wherein said transfer section includes a support member provided to project upward from said cooling plate to support a rear side of the substrate.

8. The thermal processing apparatus according to claim 7, wherein said heating unit includes a movable support member provided to move vertically to support the rear side of the substrate.

9. The thermal processing apparatus according to claim 8, wherein said holding unit has a slit to avoid interference between said movable support member provided in said heating unit and said support member provided in said transfer section.

10. The thermal processing apparatus according to claim 7, wherein said support member includes a plurality of support pins.

11. The thermal processing apparatus according to claim 1, wherein the cooling unit comprises a cooling plate having a substantially planar upper surface.

12. The thermal processing apparatus according to claim 1, wherein conductively cooling said holding unit comprises making substantial physical contact between the holding unit and an upper surface of a cooling plate within the cooling unit.

13. The thermal processing apparatus according to claim 1 wherein said holding unit is free from internal cooling mechanisms.

14. A substrate processing apparatus comprising:
 a thermal processing apparatus that performs a thermal processing to a substrate; and
 a substrate transport device that carries/takes out the substrate into/from said thermal processing apparatus while transporting said substrate, said thermal processing apparatus comprising:
 a transfer section for receiving/transferring the substrate from/to said substrate transport device;
 a heating unit that performs a heat processing to the substrate;
 a substrate transport mechanism having a holding unit movable while holding the substrate, and transporting the substrate held by said holding unit between said heating unit and said transfer section;
 a cooling unit provided in said transfer section for cooling said holding unit of said substrate transport mechanism, wherein said holding unit is cooled by coming into contact with said cooling unit; and
 a control device that controls said substrate transport mechanism so that said holding unit is cooled by coming into contact with said cooling unit during the heat processing of the substrate by said heating unit.

15. A substrate processing apparatus for performing a processing to a substrate, comprising:
 a shelf having partition plates provided in a plurality of stages; and
 a plurality of thermal processing apparatuses arranged in the plurality of stages in said shelf; and
 a substrate transport device that carries/takes out the substrate into/from said plurality of thermal processing apparatuses,
 each of said plurality of thermal processing apparatuses comprising:
 a transfer section for receiving/transferring the substrate from/to said substrate transport device;
 a heating unit that performs a heat processing to the substrate;
 a substrate transport mechanism having a holding unit movable while holding the substrate, and transporting the substrate held by said holding unit between said heating unit and said transfer section;
 a cooling unit provided in said transfer section for cooling said holding unit of said substrate transport mechanism, wherein said holding unit is cooled by coming into contact with said cooling unit; and
 a control device that controls said substrate transport mechanism so that said holding unit is cooled by coming into contact with said cooling unit during the heat processing of the substrate by said heating unit.

16. A thermal processing method in a thermal processing apparatus of a substrate processing apparatus including said thermal processing apparatus and a substrate transport device that carries/takes out the substrate into/from said thermal processing apparatus, comprising the steps of:
 receiving the substrate in a transfer section for receiving/transferring the substrate from said substrate transport device,
 transporting the substrate received by said transfer section to a heating unit while holding the substrate by a holding unit of a substrate transport mechanism;
 performing a heat processing to the substrate in the heating unit; and
 cooling said holding unit of said substrate transport mechanism by causing said holding unit to come into contact with a cooling unit provided in said transfer section during the heat processing of the substrate by said heating unit.

* * * * *